United States Patent [19]

Rice

[11] 3,878,006

[45] Apr. 15, 1975

[54] SELECTIVE ETCHANT FOR NICKEL/PHOSPHORUS ALLOY

[75] Inventor: James M. Rice, Sepulveda, Calif.

[73] Assignee: The Mica Corporation, Culver City, Calif.

[22] Filed: Oct. 26, 1973

[21] Appl. No.: 410,226

[52] U.S. Cl. .......................... 156/3; 156/8; 252/79.2

[51] Int. Cl. .......................... C23f 1/02

[58] Field of Search ......... 75/97 R, , 97 A; 96/36.2; 156/3, 8, 11, 18; 252/79.2; 29/610, 620, 621; 338/307, 308, 314

[56] References Cited

UNITED STATES PATENTS

| | | | |
|---|---|---|---|
| 2,954,289 | 9/1960 | Sherwood et al. | 75/97 |
| 3,104,167 | 9/1963 | Cotteta | 75/97 |
| 3,367,874 | 2/1968 | Haviland et al. | 252/79.2 |

FOREIGN PATENTS OR APPLICATIONS

| | | | |
|---|---|---|---|
| 459,130 | 12/1936 | United Kingdom | 75/97 |

*Primary Examiner*—William A. Powell
*Attorney, Agent, or Firm*—Wills, Green & Mueth

[57] ABSTRACT

A novel etching composition for the selective removal of resistive nickel or nickel alloy which comprises:

$CuSO_4 . 5H_2O$ — 0.5 M to 1.5 M
$H_2SO_4$ (conc.) — 0.02 M to 2 M

In the processing of a novel printed circuit board material in the form of a multilayer stock comprising an insulating support, at least one layer of a nickel or nickel alloy resistance material adhering to said support, and a layer of a highly conductive copper adhering to the resistance material and in intimate contact therewith, the improvement wherein the combined conductor and resistor patterns are formed thereon using a resist, the laminate is etched leaving a resistor surface over the unresisted areas and the unwanted resistor layer is then selectively etched using an etchant comprising:

$CuSO_4 . 5H_2O$ — 0.5 M to 1.5 M
$H_2SO_4$ (conc.) — 0.02 M to 2 M

7 Claims, 1 Drawing Figure

ETCH RATE OF 25Ω/SQ.
LAMINATE IN $CuSO_4$

ETCH RATE OF 25Ω/SQ.
LAMINATE IN $CuSO_4$
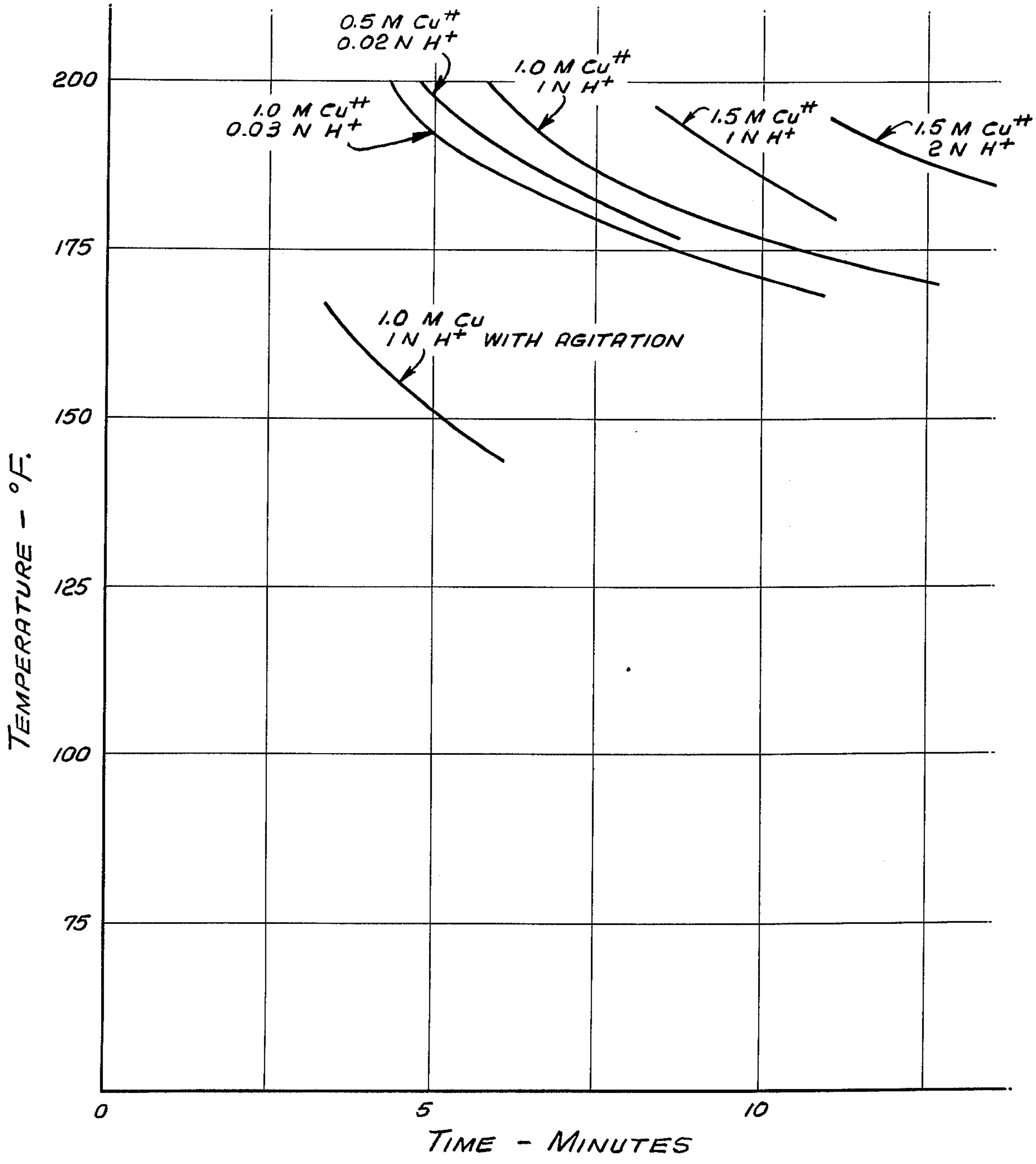

SELECTIVE ETCHANT FOR NICKEL/PHOSPHORUS ALLOY

BACKGROUND OF THE INVENTION

In assignee's copending U.S. Pat. application Ser. No. 273,756 filed July 21, 1972, the disclosure of which is expressly incorporated herein by reference, there is described a novel printed circuit board material in the form of a multilayer stock comprising an insulating support, at least one layer of electrical resistance material adhering to said support, and a layer of a highly conductive material adhering to the resistance material and in intimate contact therewith, said layer of electrical resistance material comprising electroplated nickel alone, or together with up to 30 % by weight of phosphorus. In one embodiment, the electroplated nickel or nickel-phosphorus also contains a major portion of the oxides, hydroxides and/or peroxides of nickel on that surface of the resistive layer abutting the support which provides improved bonding of the resistive material to the support, improved high temperature stability, and higher resistivity per unit area.

Some difficulty has been encountered in selectively removing nickel/phosphorus resistive layer from between copper conductor lines of the above-described printed circuit boards. One approach to the problem had been to employ a system that would etch both copper and the M alloy, and then retard the etch rate to copper. Examples nickel this method are dilute cupric chloride, and dilute and concentrated ferric sulfate. However, these etchants cannot be used with bare or exposed copper because of the galvanic protection afforded by the copper to the nickel alloy resulting in resistive layer shoulders which will literally never be removed. The problem is insurmountable with fine line spaces. An alternative would be to find an oxidizing agent with a potential intermediate between copper and nickel.

Referring to the oxidation reduction potential of nickel +0.250v and copper −0.3448v (hydrogen being 0.00v) the most logical choice would be a stannic salt of a non-interfering anion such as stannic sulfate:

$Sn^{+2} = Sn^{+4} + 2e^- \; -0.15v$

Both stannic sulfate and stannic chloride were found to be ineffective. Another candidate would be cupric ion in the reaction:

$Cu^+ = Cu^{++} + e^- \; -0.167v$

Salts such as the chloride or nitrate could not be used as they are known oxidizing agents for copper. Cupric sulfate seemed a remote possibility, since the classical qualitative test for copper is to hang a nail in solution and plate copper by replacement.

| | |
|---|---|
| $Fe = Fe^{++} + 2e^-$ | +0.440v |
| $Cu = Cu^{++} + 2e^-$ | −0.3448 v |
| $Fe + Cu^{++} = Cu + Fe^{++}$ | 0.7848v |

That is, the copper is completely reduced rather than remaining in the cuprous state. Quite surprisingly, it was found, however, that a solution of cupric sulfate would indeed dissolve the nickel-phosphorus alloy layer without touching the copper. Furthermore, instead of shouldering, dissolution of the nickel alloy appeared to start at the copper interface indicating that the potential of the copper actually catalyzes the reaction.

SUMMARY OF THE INVENTION

Briefly, the present invention comprises a novel etching composition for the selective removal of resistive nickel or nickel alloy which comprises:

$CuSO_4 \cdot 5H_2O$ — 0.5 M to 1.5 M $H_2SO_4$ (conc.) — 0.02 M to 2 M

This invention also includes processing of a novel printed circuit board material in the form of a multilayer stock comprising an insulating support, at least one layer of nickel or a nickel alloy resistance material adhering to said support, and a layer of a highly conductive copper adhering to the resistance material and in intimate contact therewith, the improvement wherein the combined conductor and resistor patterns are formed in etch resist on the copper surface, the exposed copper is etched away leaving the underlying resistor layer on the portion of the board from which the copper was removed, and the unwanted portion of the resistor layer then is selectively removed with essentially no attack on the edges of the copper lines formed in the preceding etch step by immersing the board in an etchant comprising:

$CuSO_4 \cdot 5H_2O$ — 0.5 M to 1.5 M $H_2SO_4$ (conc.) — 0.02 M to 2 M

It is an object of this invention to provide a novel selective etchant.

More particularly, it is an object of this invention to provide a new etchant for resistive nickel or a nickel alloy in the presence of copper.

It is a particular object of my invention to provide a novel etchant which is useful in the processing of the above-described printed circuit board.

It is also a particular object of this invention to provide an etchant which removes nickel or a nickel alloy without attacking copper.

These and other objects and advantages of this invention will be more apparent from the detailed description which follows.

DESCRIPTION OF THE PREFERRED EMBODIMENTS

The curves of the drawing show the etching rate of 25 ohm per square nickel-phosphorus (the preferred nickel alloy) in the various compositions of cupric sulfate and sulfuric acid. The etchant can vary in composition from 0.5 M to 1.5 M $CuSO_4 \cdot 5H_2O$ and from 0.02 M to 2 M to 2 M $H_2SO_4$. The optimum composition was found to be:

| | |
|---|---|
| $CuSO_4 \cdot 5H_2O$ | 250 g/l |
| $H_2SO_4$ (conc.) | 2 ml/l |

In general, concentrated $H_2SO_4$ contains from about 95% to 98% $H_2SO_4$.

The following example is presented solely to illustrate the invention, and should not be regarded as limiting the invention in any respect.

Using the laminate or printed circuit board stock referred to above, the combined conductor and resistor patterns are screened or photographically developed thereon with any of the commonly available resists. The laminate is etched with any conventional copper etchant leaving the black resistor surface over the entire exposed portion of the board. Next, the unwanted resistor layer is etched in the resistor layer etchant of this invention. The conductor pattern is formed on the remaining copper using a resist which is processable in alkaline aqueous solutions. The board then is etched in chromic sulfuric acid to remove the copper overlaying the resistor lines, thus completing the conductor-resistor pattern. The resist is stripped in an alkaline aqueous solution, the resistor lines are conformally coated for protection, and the board is ready for the next manufacturing operation.

While not bound by any theory, it appears that the function of the sulfuric acid is to prevent the precipitation of basic copper salts. While the optimum temperature appears to be 200°F. for immersion etching, it is probable that an operating temperature of 130°F. could be employed in a spray etcher.

Coupons of one ounce copper showed no degradation when immersed for 24 hours at 200°F. It appears, then, that the present invention provides a truly selective etchant for resistive nickel and nickel alloys such as nickel/phosphorus in the presence of copper. This presents a great processing advantage and advance in the art.

Having fully described the invention, it is intended that it be limited only by the lawful scope of the appended claims.

I claim:

1. A novel etching composition for the selective removal of resistive nickel or nickel alloy in the presence of copper which comprises:

$CuSO_4 . 5H_2O$ — 0.5 M to 1.5 M $H_2SO_4$ (conc.) — 0.02 M to 2 M

2. A novel etching composition for the selective removal of resistive nickel or nickel alloy in the presence of copper which comprises:

$CuSO_4 . 5H_2O$ — 250 gm/liter $H_2SO_4$ (conc.) — 2 ml/liter

3. The processing of a novel printed circuit board material in the form of a multilayer stock comprising an insulating support, at least one layer of nickel or a nickel alloy resistance material adhering to said support, and a layer of highly conductive copper adhering to the resistance material and in intimate contact therewith, the improvement wherein the combined conductor and resistor patterns are formed thereon using a resist, the laminate is etched leaving a resistor surface over the unresisted areas, and the unwanted resistor layer is then selectively etched using an etchant comprising:

$CuSO_4 . 5H_2O$ — 0.5 M to 1.5 M $H_2SO_4$ (conc.) — 0.02 M to 2 M

4. The processing of claim 3 wherein the unwanted resistor layer is selectively etched at a temperature of from about 130°F. to 200°F.

5. The processing of claim 3 wherein said etchant comprises:

$CuSO_4 . 5H_2O$ — 250 gm/liter $H_2SO_4$ (conc.) — 2 ml/liter

6. The processing of claim 5 wherein the unwanted resistor layer is selectively etched at a temperature of from about 130°F. to 200°F.

7. The processing of claim 3 wherein said resistance material is a nickel-phosphorus alloy.

* * * * *